US008878563B2

(12) United States Patent
Robbins

(10) Patent No.: US 8,878,563 B2
(45) Date of Patent: Nov. 4, 2014

(54) SYSTEM AND APPARATUS FOR ARC DETECTION AND LOCATION IN SOLAR ARRAYS

(75) Inventor: Steven Andrew Robbins, Calabasas, CA (US)

(73) Assignee: Steven Andrew Robbins, Calabasas, CA (US)

( * ) Notice: Subject to any disclaimer, the term of this patent is extended or adjusted under 35 U.S.C. 154(b) by 424 days.

(21) Appl. No.: 13/272,610

(22) Filed: Oct. 13, 2011

(65) Prior Publication Data

US 2013/0092208 A1 Apr. 18, 2013

(51) Int. Cl.
*G01R 31/26* (2014.01)
*H01L 31/02* (2006.01)
*G01R 31/12* (2006.01)

(52) U.S. Cl.
CPC .......... *H01L 31/02021* (2013.01); *Y02E 10/50* (2013.01); *G01R 31/1227* (2013.01)
USPC .................................. 324/761.01

(58) Field of Classification Search
CPC .......... H01L 31/02021; H02H 1/0015; G01R 31/2605; Y02E 10/50
USPC ...................... 324/761.01; 361/42
See application file for complete search history.

(56) References Cited

U.S. PATENT DOCUMENTS

| | | | | |
|---|---|---|---|---|
| 4,728,950 A * | 3/1988 | Hendrickson et al. | ... | 340/870.31 |
| 5,206,596 A * | 4/1993 | Beihoff et al. | ................ | 324/536 |
| 5,729,145 A * | 3/1998 | Blades | ........... | 324/536 |
| 6,029,438 A * | 2/2000 | Hosick | ............ | 60/202 |
| 6,772,077 B1 * | 8/2004 | Parker et al. | .................... | 702/76 |
| 8,175,755 B2 * | 5/2012 | Kirchner et al. | ............. | 700/293 |
| 2001/0036047 A1 * | 11/2001 | Macbeth et al. | ................ | 361/42 |
| 2010/0154858 A1 * | 6/2010 | Jain | ................ | 136/244 |
| 2011/0125431 A1 * | 5/2011 | Adest et al. | .................... | 702/58 |
| 2011/0141644 A1 * | 6/2011 | Hastings et al. | ............. | 361/93.2 |
| 2011/0163606 A1 * | 7/2011 | Kumar et al. | .................. | 307/84 |
| 2011/0254534 A1 * | 10/2011 | Dorr et al. | ....................... | 324/72 |
| 2011/0301772 A1 * | 12/2011 | Zuercher et al. | ............. | 700/293 |
| 2012/0133208 A1 * | 5/2012 | Kalhoff et al. | .................. | 307/71 |
| 2012/0174961 A1 * | 7/2012 | Larson et al. | ............. | 136/246 |
| 2012/0268158 A1 * | 10/2012 | Miyata et al. | ............ | 324/761.01 |
| 2012/0275071 A1 * | 11/2012 | Gutierrez et al. | .............. | 361/42 |
| 2012/0297483 A1 * | 11/2012 | Boot et al. | ....................... | 726/23 |
| 2013/0024043 A1 * | 1/2013 | Shaffer et al. | ................ | 700/297 |

* cited by examiner

*Primary Examiner* — Patrick Assouad
*Assistant Examiner* — Demetrius Pretlow

(57) ABSTRACT

A system and apparatus for detecting and locating an arc fault in a photovoltaic solar power array. A plurality of capacitors divide strings of photovoltaic cells into a series of magnetic loops. When an arc fault occurs within one of the loops, a time-varying magnetic field is produced, with flux lines emanating from the area enclosed by the loop. At least three magnetic field sensors arranged at locations in or around the solar power array detect the spectral signature of the arc fault, and send related data to a computer via a communication network. The computer analyzes the data from the sensors to determine the location of the arc fault.

10 Claims, 8 Drawing Sheets

SYSTEM AND APPARATUS FOR ARC DETECTION AND LOCATION IN SOLAR ARRAYS

BACKGROUND

The invention relates generally to the field of solar power, and more specifically to methods of detecting and locating arc faults in photovoltaic solar power arrays.

The solar power industry is facing a growing safety concern over arc faults. The reason relates to the way in which conventional photovoltaic solar power arrays are constructed, producing high voltage dc in a circuit with a large number of series connections. For example, a typical photovoltaic cell produces about 0.5 Vdc in full sunlight, and a typical solar power module includes seventy two cells. Therefore, an array of sixteen such modules wired in series would produce about 576 Vdc, and the system would have 1152 series connections (not counting additional connections in the junction boxes, combiner boxes, inverter, etc.). If any one of these connections opens, then the entire output voltage of the solar array is concentrated across the small gap, resulting in a dc arc that can reach temperatures of several thousand degrees, and is often difficult to extinguish.

The industry has been building conventional arrays like this for a long time, and there are now a large number that have been in the field for twenty years or more. These systems are beginning to show signs of age, and the annual number of reported fires is starting to rise. This is why the 2011 National Electrical Code (NEC) now requires an Arc Fault Circuit Interrupter (AFCI) in solar arrays that produce more than 60 Vdc.

Various companies are working on developing AFCI products for solar power arrays. FIG. 1 shows a typical example of a solar power system 1 that utilizes conventional AFCI. An array 2 consisting of strings 3 of photovoltaic cells 4 and blocking diodes 5 is connected to an inverter 6 via a power bus with positive 7 and negative 8 rails. A conventional arc detector 9 is coupled to the power rails via capacitors 10. When an arc is detected, the arc detector 9 opens the power switches 11, interrupting the current, and thus extinguishing the arc.

The conventional arc detector 9 looks for the spectral signature generated by the arc fault. FIG. 2 shows a typical example of such a signature, where the current is approximately inversely related to the frequency; a relationship that is commonly referred to as a 1/f spectrum. Since both axes of the graph in FIG. 2 are logarithmic, a 1/f spectrum appears as a straight line with a downward slope, as shown.

A conventional system such as the system 1 faces several technical challenges. First, a large solar array can act as a large antenna, picking up noise from the environment and creating the potential for false alarms. Second, the array can act as a filter that distorts the arc signature, or makes environmental noise look more like an arc signature. And third, even if the arc detector 9 can reliably detect the presence of the arc, it cannot locate the arc; so it may be difficult to get the system 1 back up after a shutdown.

The problem of not being able to locate the arc is significant. If the system 1 works properly, it will shut down before any significant damage occurs, so there may be little visible evidence of the arc. In fact, an arc can occur inside the junction box on the back side of a solar module where it cannot be seen without disassembly of the module. What is more, a typical solar power array can cover a large area. Searching for a small burn pattern in a large array can be like looking for the proverbial needle in a haystack. An operator may be forced to power up the system repeatedly until enough damage accumulates to make the location of the fault apparent. And what is worse, if the arc cannot be found, then maintenance personnel may mistakenly assume the shutdown was a false alarm. This is worrisome because some people may actually try to circumvent the AFCI system if the "false" alarms persist.

Accordingly, there is a strong need in the field of photovoltaic solar power for a system and apparatus for detecting an arc fault in solar arrays, and determining its general location. The present invention fulfills these needs and provides other related benefits.

SUMMARY

The system for detecting and locating arc faults in a solar power array includes a solar power array having at least one string of photovoltaic (PV) cells connected in series. Each string is divided into segments and capacitors are connected in parallel with the segments to form magnetic loops. When an arc fault occurs within a loop, a time-varying magnetic field is generated. Sensors inside, or around, the array measure magnetic field intensity in a plurality of frequencies to detect the spectral signature produced by an arc fault. When an arc fault is detected, a computer gathers data from the sensors via a communication network. The computer knows the locations of the sensors in relation to the array, and determines the location of the arc fault from the sensor data. The magnetic field sensors may be separate units, or they may be integrated into solar power modules. The communication network may utilize cables, radio, or power lines to carry data from the sensors to the computer.

BRIEF DESCRIPTION OF THE DRAWINGS

The accompanying drawings illustrate the invention. In such drawings.

DETAILED DESCRIPTION

Figure 3:
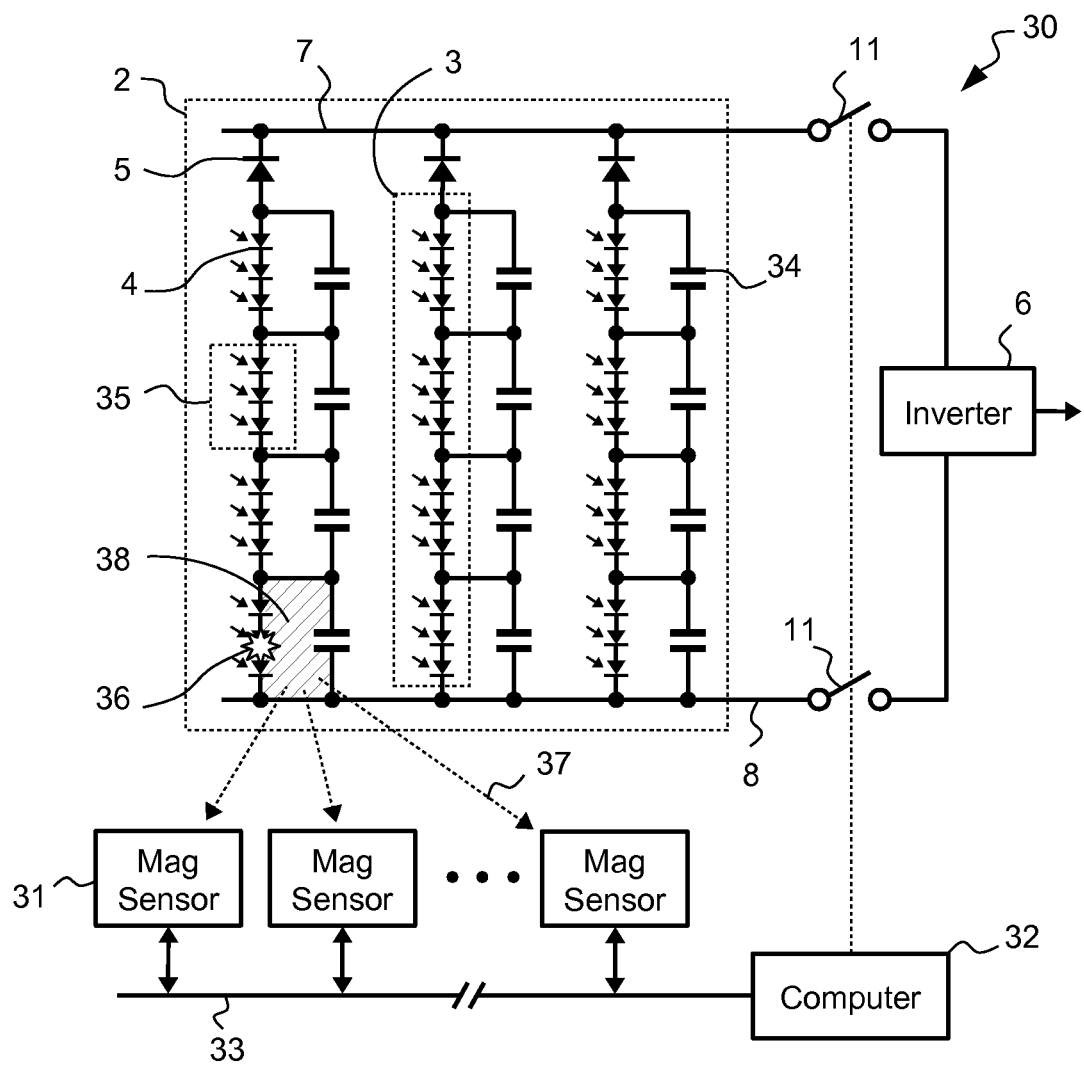
FIG. 3 is a high level block diagram of the a solar power system as disclosed herein.

FIG. 3 shows a high level block diagram of a system for arc detection and location in solar arrays 30 as disclosed herein. The system 30 is similar to the conventional system 1 described above, but with the conventional arc detector 9 replaced by a plurality of magnetic field sensors 31 linked to a computer 32 via a communication network 33, and a plurality of capacitors 34 that divide the strings 3 into segments 35.

When sunlight falls on a segment 35 of PV cells it conducts electricity, like a wire. At high frequencies, the capacitors 34 essentially act as short circuits, closing each segment 35 into a magnetic loop having an area 38. A magnetic loop, also sometimes referred to as a small loop antenna, is simply a conductive loop with one or more turns and a circumference that is much smaller than the wavelength of the signal frequency. For example, a 500 kHz signal has a wavelength of about 600 m, while each magnetic loop in the system 30 may have a circumference of roughly 2 m. This small size prevents magnetic loops from generating or detecting electromagnetic waves. Instead, magnetic loops only emit or detect magnetic flux in the near field.

When an arc fault 36 occurs, it modulates the dc current flowing in the PV cells 4 to create an ac current with an approximately 1/f spectrum. The capacitors 34 confine the ac current to the particular magnetic loop where the arc occurred. Therefore, the resulting ac magnetic flux 37 is emitted only from the relatively small area 38 enclosed by the loop. The magnetic flux lines 37 fan out in all directions from the loop area 38 and some flux lines are detected by the magnetic field sensors 31. The magnetic field intensity decreases with distance according to the inverse square law. Therefore, each magnetic field sensor 31 detects a signal with an amplitude related to its distance from the arcing loop. By comparing the magnitudes of the signals detected by at least three magnetic field sensors 31, the location of the arcing loop can be determined.

Figure 4A:
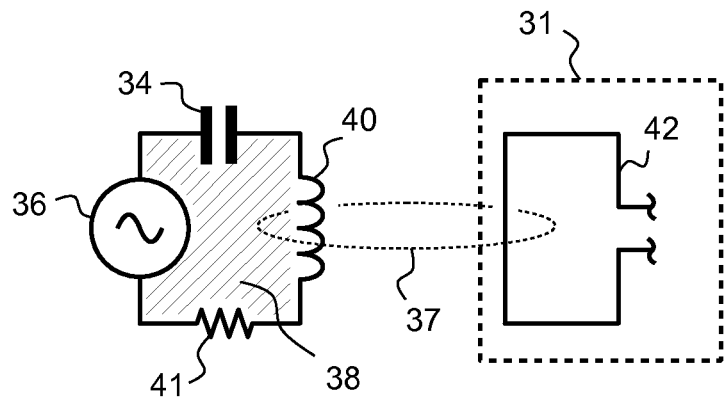
FIG. 4A is an equivalent circuit illustrating the concept of detecting arcs via magnetic fields.

FIG. 4A shows an equivalent circuit to help explain these concepts in more detail. The arc 36 is represented by an ac signal source. The capacitor 34 and the self-inductance 40 of the segment 35 of PV cells form a resonant circuit. The resistance 41 represents the total resistance of the loop, including the dynamic resistance of the PV cells. The ac current flow produced by the arc 36 creates ac magnetic flux 37 in the loop area 38. Some of the magnetic flux lines 37 couple to a second loop 42 inside one of the magnetic field sensors 31. Thus the two circuits are essentially transformer coupled; the two loops form the windings of an air-core transformer with a coupling coefficient that decreases as the two loops get farther apart.

Figure 4B:
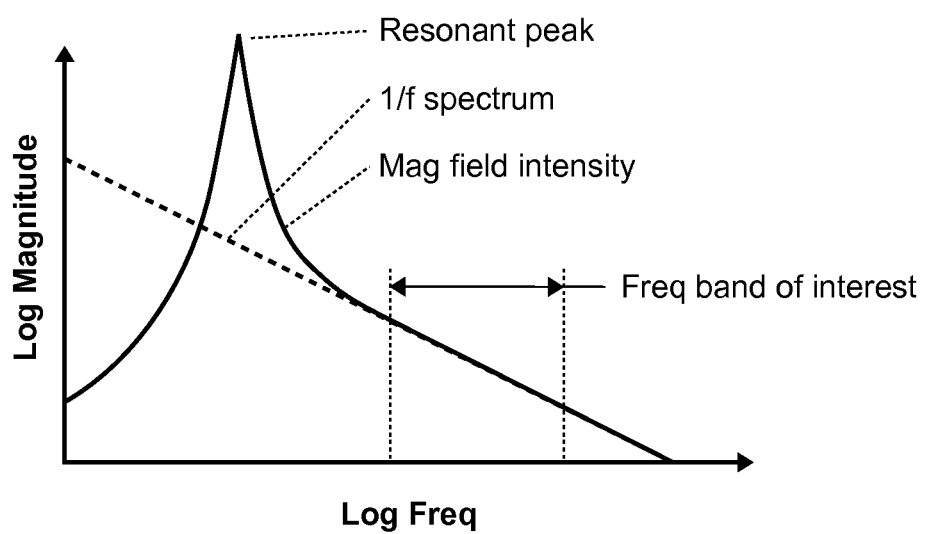
FIG. 4B is a graph showing magnetic field intensity versus frequency.

FIG. 4B shows an idealized approximation of the magnetic field intensity spectrum produced when an arc occurs. At the lowest frequencies, the magnetic field intensity is low because the impedance of the capacitor 34 is too high; the ac current is not confined to the loop, and it flows throughout the system. Going up in frequency, we reach a resonant peak, and then at higher frequency the capacitor 34 essentially becomes a short circuit and the curve follows the characteristic 1/f arc spectrum. The magnetic field sensors 31 are designed to operate in this upper frequency band, referred to hereafter as "the frequency band of interest", where the arc signature is relatively undistorted by the resonance, and reasonably strong.

Figure 1:
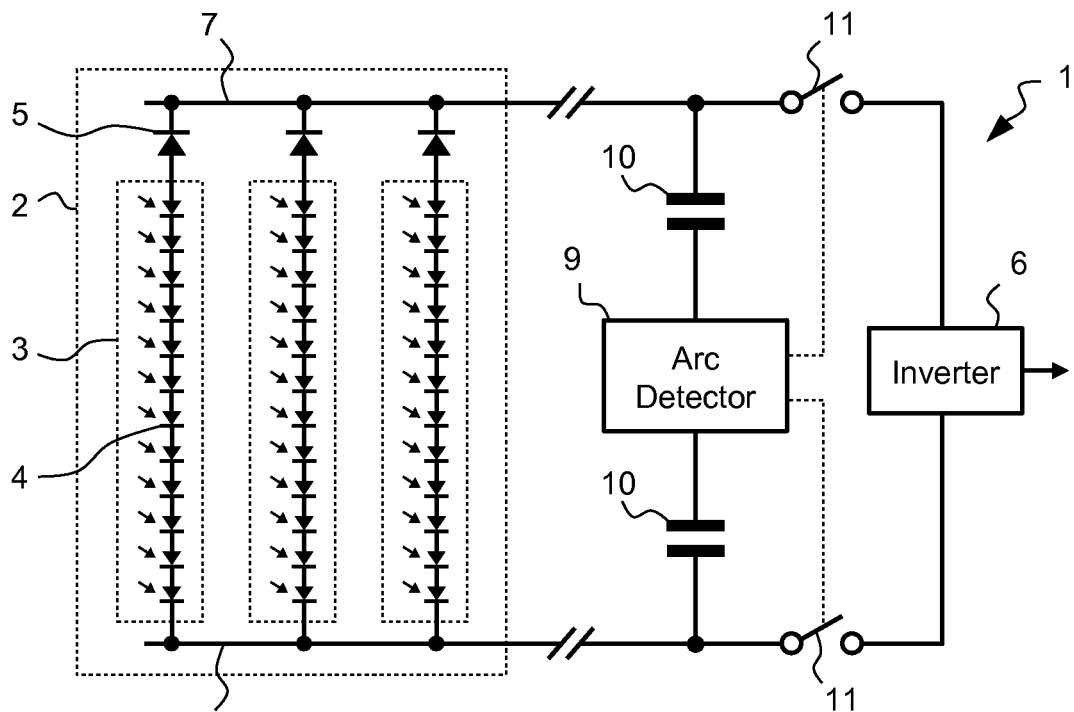
FIG. 1 is an example of a photovoltaic solar power system utilizing conventional arc detection.
Figure 2:
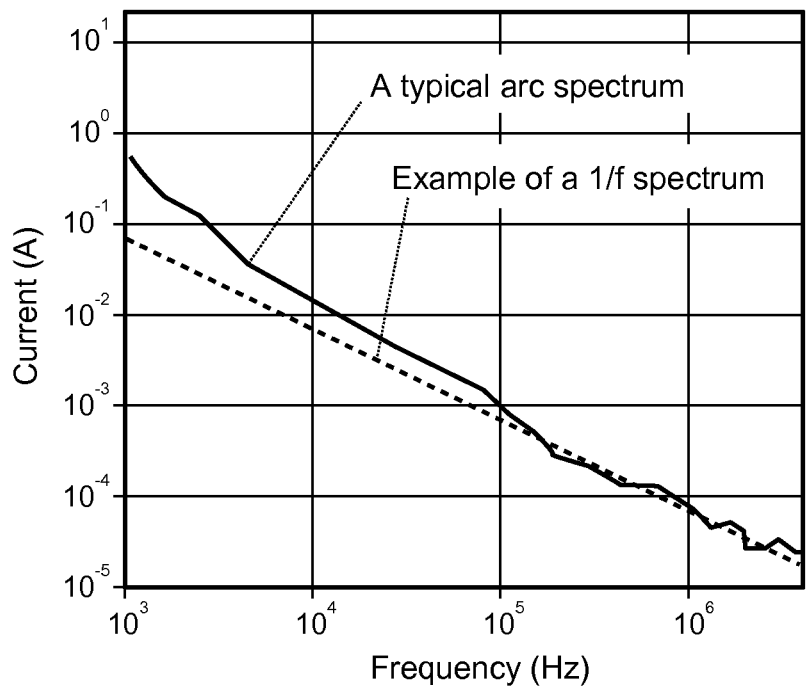
FIG. 2 is a graph depicting a typical spectrum generated by an arc fault.

The capacitors 34 are chosen to lower the resonant frequency well below the frequency band of interest. For example, referring to FIG. 2 we may choose 100 kHz to 500 kHz as the frequency band of interest. To avoid significant distortion of the signature, we could for example, set the resonant frequency two octaves below the bottom of our band, at 25 kHz. If the self-inductance of a segment 35 of PV cells is 5 µH, we would select a capacitor of at least 8 µF using $C > 1/L(2\pi f_R)^2$, where $f_R$ is the resonant frequency.

Figure 5A:
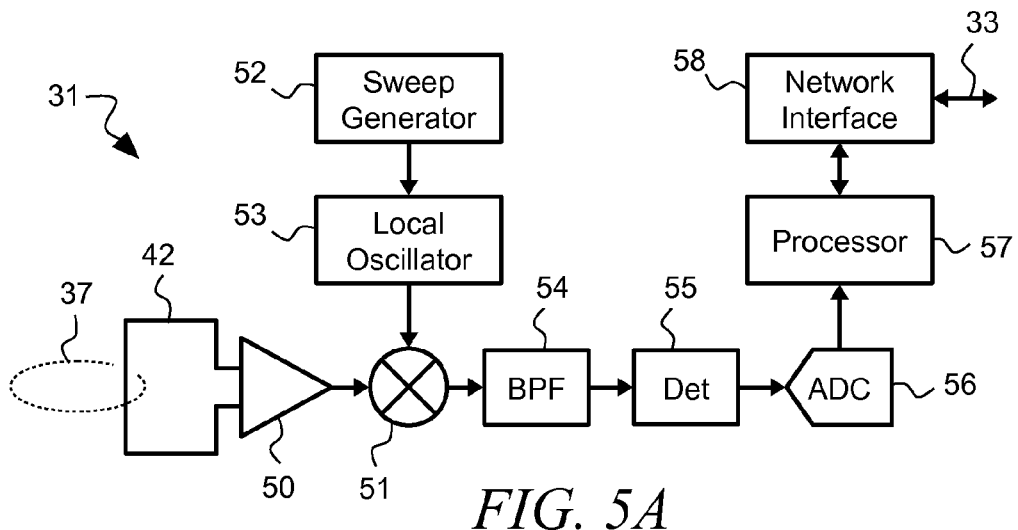
FIG. 5A is a high level block diagram of an exemplary embodiment of the magnetic field sensors.

FIG. 5A is a high level block diagram showing a first exemplary embodiment of a magnetic field sensor 31. Some of the magnetic flux lines 37 produced by the arcing magnetic loop are picked up by the receiving magnetic loop 42, resulting in an ac current that is converted to a voltage and amplified by the front-end amplifier 50. The amplifier 50 may also serve as a pre-selection filter to remove noise outside the frequency band of interest. Next, the well-known superheterodyne architecture is implemented, where a local oscillator 53, mixer 51, and bandpass filter 54 shift the signal to another frequency band. Normally in a receiver, superheterodyne is used to down-convert the received signal to a lower frequency; however, since the frequency band of interest is already very low, the signal may be up-converted instead. For example, the signal may be up-converted to a center frequency of approximately 5 MHz. The higher frequency makes the circuit smaller, and easier to integrate onto a chip. After up-conversion, the signal goes through a detector 55, is digitized by an Analog-to-Digital Converter (ADC) 56, and the digitized data goes to a processor 57. A sweep generator 52 scans controls the local oscillator 53, so the digitized data received by the processor 57 over one complete sweep represents the magnetic field intensity spectrum over the band of interest.

Figure 5B:
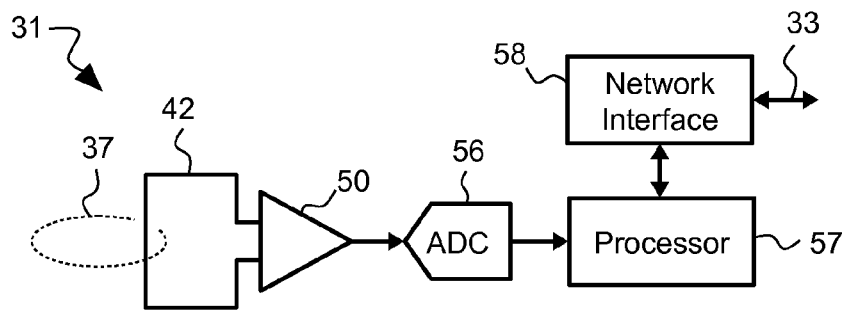
FIG. 5B is a high level block diagram of another exemplary embodiment of the magnetic field sensors.

FIG. 5B is a high level block diagram showing a second exemplary embodiment of a magnetic field sensor 31 utilizing direct conversion. The amplifier 50, in addition to preselecting the band, may also serve as an anti-aliasing filter. The ADC 56 sample rate is much higher than the highest frequency in the band of interest, for example five million samples per second (5 Msps). The processor 57 accumulates a number of samples (typically 512 or 1024) and performs a Fast Fourier Transform (FFT) producing an approximation of the magnetic field intensity spectrum.

Figure 5C:
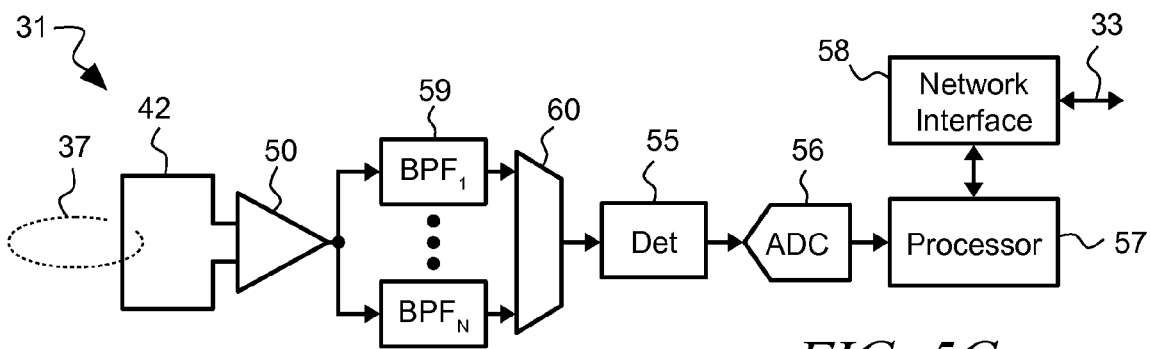
FIG. 5C is a high level block diagram of yet another exemplary embodiment of the magnetic field sensors.

FIG. 5C is a high level block diagram showing a third exemplary embodiment of a magnetic field sensor 31 utilizing a channelized architecture including a plurality of bandpass filters 59 ($BPF_1$-$BPF_N$) and a multiplexer 60. Each filter 59 has a different center frequency, the frequencies typically distributed evenly on a log scale over the band of interest. The multiplexer scans the channels, and the peak detector 55 produces a dc voltage proportional to the amplitude of the signal, which is then sampled by the ADC 56.

In all three examples shown in FIGS. 5A-5C the processor 57 analyzes the acquired magnetic field intensity data to detect the presence of an arc signature. The analysis typically includes one or more tests to determine how well the data conforms to a 1/f spectrum. In this respect, the data is first converted to log/log scales. For example, the amplitude of the signal may be converted to a log scale by computations in the processor 57, or the ADC 56 may have a log transfer function, or the detector 55 may have a log transfer function. Next, the processor 57 applies linear regression to the log/log data, producing a correlation coefficient and a best-fit slope. If both the correlation coefficient and best-fit slope are within predefined limits, then the magnetic field sensor 31 signals the computer 32 via the communication network 33 that an arc 36 has been detected.

Figure 6A:
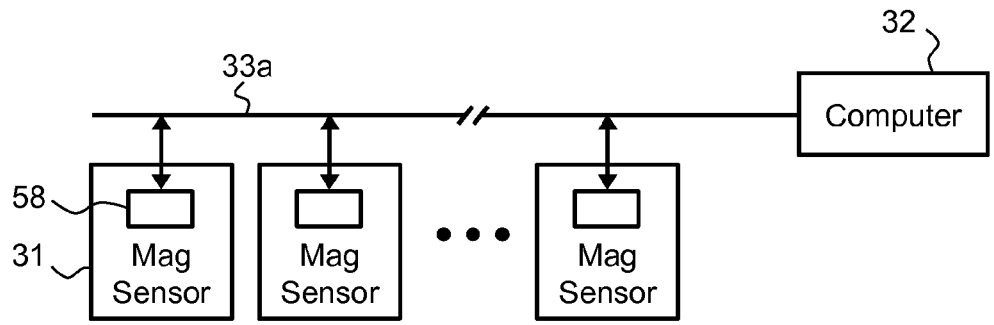
FIG. 6A is a high level block diagram showing the communication network utilizing cables.

The magnetic field sensors 31 also include a network interface 58 for communicating with the computer via the communication network 33. The network interface 58 has several embodiments illustrated in the high level block diagrams in FIGS. 6A-6C. FIG. 6A shows a first embodiment of the magnetic field sensor 31 wherein the network interface 58 connects to cables 33a. The cables 33a carry the sensor data to the computer 32, and may also carry power from the computer 32 to operate the sensors 31. For example, the network interface 58 may comply with the Fieldbus (IEC 61158) standard, or one of the many Fieldbus derivatives.

Figure 6B:
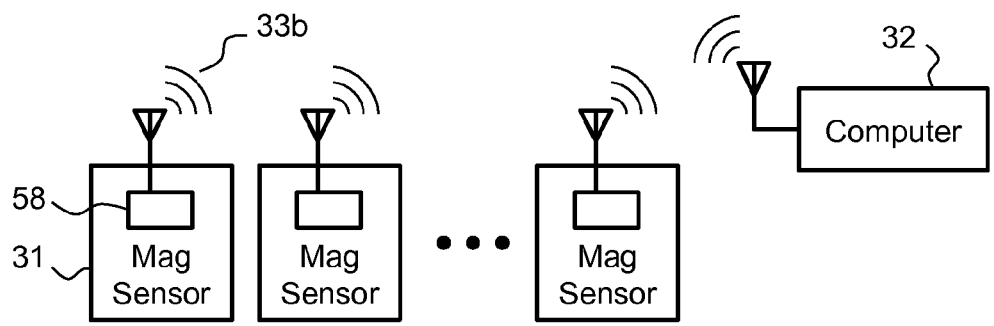
FIG. 6B is a high level block diagram showing the communication network utilizing radio links.

FIG. 6B shows a second embodiment of the magnetic field sensor 31 wherein the network interface 58 comprises a means of communicating via radio waves 33b. For example, network interface 58 may comprise a transceiver that complies with any of a variety of standards such as Wi-Fi (IEEE Standard 802.11), BlueTooth, or ZigBee (IEEE Standard 802.15.4).

Figure 6C:
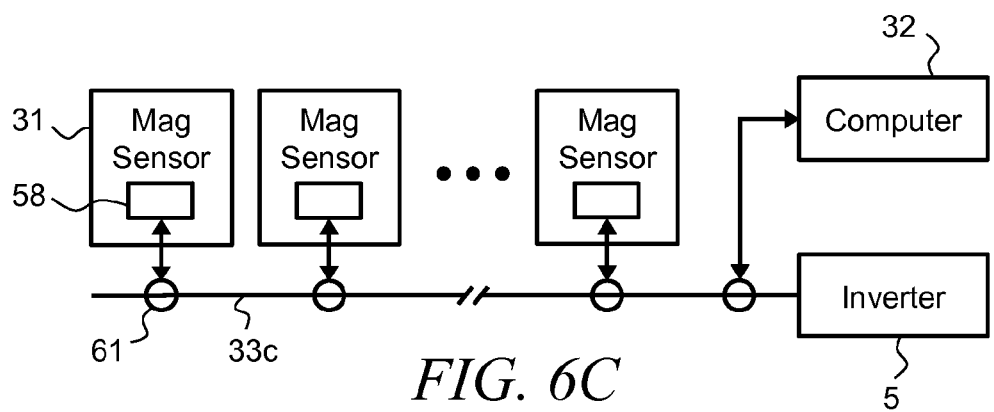
FIG. 6C is a high level block diagram showing the communication network utilizing power line communications.

FIG. 6C shows a third embodiment of the magnetic field sensor 31 wherein the network interface 58 comprises a means of communicating over a power line 33c. Typically, the network interface 58 is coupled to the power line 33c with a current transformer 61 such as a Rogowski coil. The power line 33c may be the positive 6 or negative 7 rails that carry power from the array 2 to the inverter 6. For example, the network interface 58 may comply with any of the Power-Line Communications (PLC) standards such as HomePlug AV (IEEE 1901), or IEC 61334.

Best performance is achieved when the magnetic loops 38 in the array 2 and the magnetic loops 42 in the sensors 31 are all coplanar. This is because magnetic loops have a field pattern with maximum gain along the plane of the loop, and nulls perpendicular to that plane. In fact, this is one of the advantages of the using magnetic fields rather than radio waves. Solar panels are typically mounted facing up toward the sky, so the nulls of the magnetic loops all point up. This is advantageous because interference such as commercial AM radio signals generally come down from the sky.

Figure 7A:
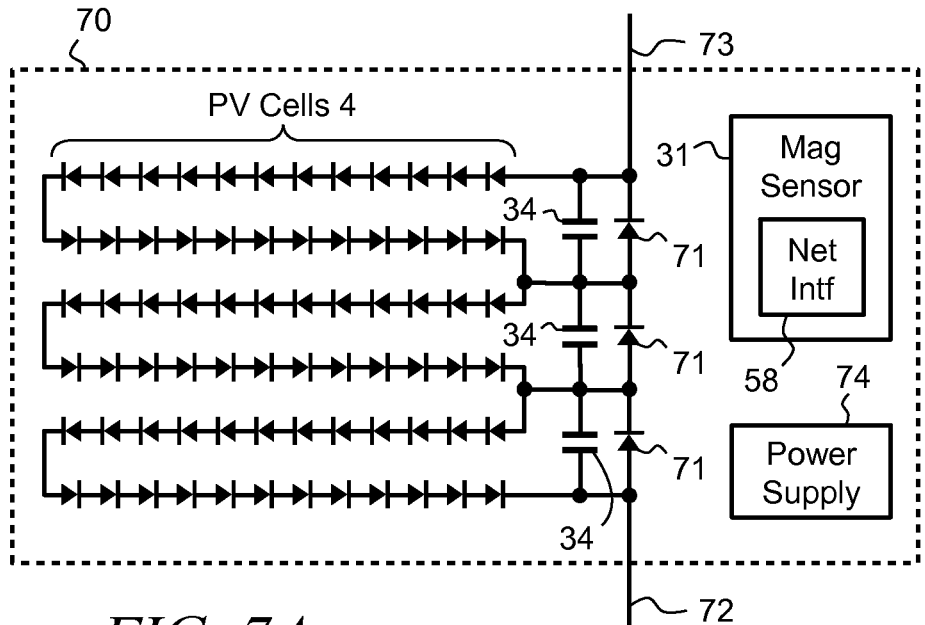
FIG. 7A is a high level block diagram showing a solar power module including hardware for arc detection and location.

One way to assure coplanar loop orientation is to build the sensors 31 into the array 2. FIG. 7A shows a first exemplary embodiment of the apparatus in the form of a solar module 70 comprising: a chain of PV cells 4 divided into segments by capacitors 34; a magnetic field sensor 31 including a network interface 58; and a power supply 74 for powering the sensor 31 and interface 58. The module 70 connects to the rest of the array 2 via positive 73 and negative 72 power cables. Bypass diodes 71 are also typically included to protect the PV cells 4 from damage when the module 70 is partially shaded.

Figure 7B:
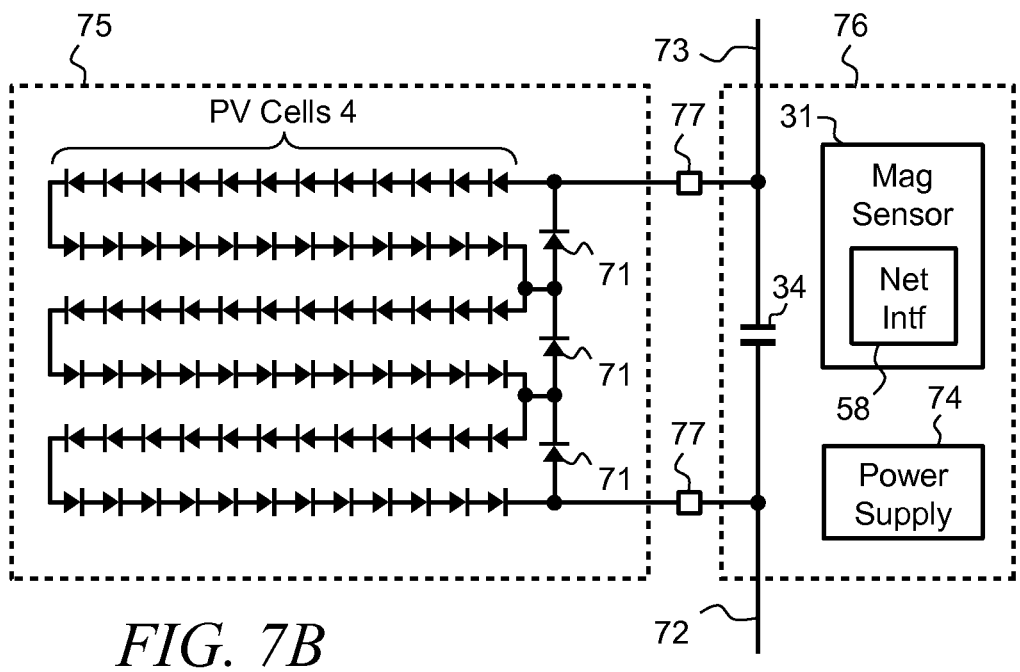
FIG. 7B is a high level block diagram showing a solar power module with attached hardware for arc detection and location.

FIG. 7B shows a second exemplary embodiment of the apparatus where the circuitry—31, 34, 58, and 74—is housed in a sensor unit 76 that connects to a conventional solar module 75 via connectors 77. This embodiment allows a conventional array to be retrofitted for arc detection and location by attaching the sensor units 76. The single capacitor 34 forms a single magnetic loop comprising all the PV cells 4 in the module 75. The sensor unit 76 is typically designed to attach physically to the module 75, so that the magnetic loop 42 in the sensor 31 has the desired coplanar orientation.

One advantage of the embodiments shown in FIGS. 7A-7B is that the power supply 74 can draw power from at least some of the PV cells 4. For example, the power supply 74 inputs are typically connected to the positive 73 and negative 72 nodes.

Figure 7C:
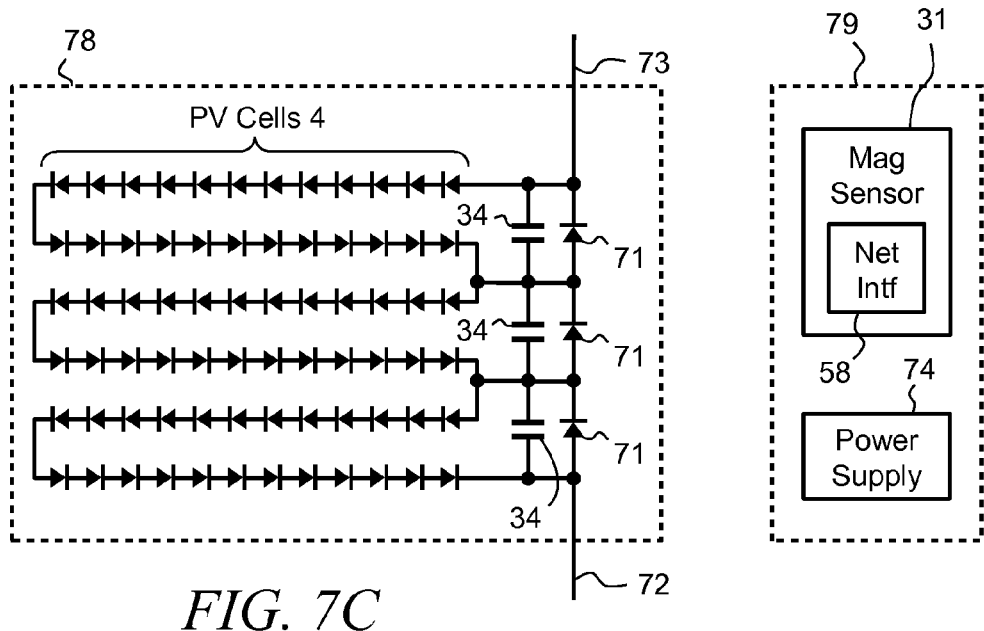
FIG. 7C is a high level block diagram showing a solar power module with separate hardware for arc detection and location.

FIG. 7C shows a third embodiment of the apparatus wherein, a solar module 78 comprises the capacitors 34 for forming the magnetic loops, but the rest of the circuitry—31, 58, and 74—is housed on a separate sensor unit 79. In this embodiment, the separate sensor unit 79 does not connect to the PV cells 4, so the power supply 74 typically receives power via a network cable 33a as described previously. One advantage of this embodiment is that the separate sensor units 79 are typically placed around the periphery of the array 2, making them more easily accessible for maintenance.

Figure 8:
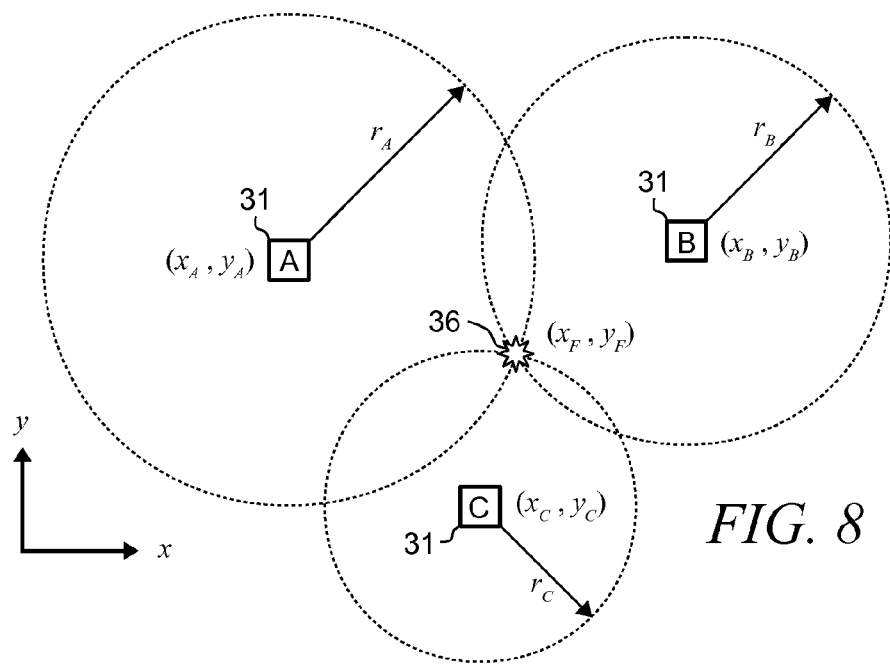
FIG. 8 illustrates an arc located with a minimum of three sensors.

When an arc fault is detected by at least one magnetic field sensor 31, the task of locating the arc fault 36 begins. FIG. 8 shows an XY plane containing three sensors 31 designated A, B, and C. The arc fault 36 is also in this same XY plane. Each sensor 31 sees a relative signal strength inversely proportional to the square of its distance from the arc 36. Let $S_A$, $S_B$, and $S_C$ represent the signal strengths on a linear scale, seen by sensors A, B, and C respectively. Also, assume that all three sensors have the same gain. Then the ratios of distances are given by, $$\left(\frac{r_A}{r_B}\right)^2 = \frac{(x_A - x_F)^2 + (y_A - y_F)^2}{(x_B - x_F)^2 + (y_B - y_F)^2} = \frac{S_B}{S_A}, \text{ and}$$

$$\left(\frac{r_A}{r_C}\right)^2 = \frac{(x_A - x_F)^2 + (y_A - y_F)^2}{(x_C - x_F)^2 + (y_C - y_F)^2} = \frac{S_C}{S_A}.$$

The three radii $r_A$, $r_B$, and $r_C$ define three overlapping circles as shown in FIG. 8. The three circles intersect at a point $(x_F, y_F)$ where the arc fault 36 is located. Therefore the two equations above give a solution for $(x_F, y_F)$ provided the sensor coordinates $(x_A, y_A)$, $(x_B, y_B)$, and $(x_C, y_C)$ are known.

Therefore, to perform these calculations the computer 32 needs to know the locations of the sensors 31 in relation to the solar array 2. The sensor 31 locations can be determined in various ways. For example, suppose the array 2 comprises solar power modules 78 with built-in capacitors 34 as shown in FIG. 7C. Assume sixteen such modules 78 are arranged in a matrix of four rows by four columns, and sensor units 76 (such as shown in FIG. 7B) are attached to three of the corner modules 78. Assuming the computer 32 knows the length-to-width ratio of an individual module 78, then the computer can determine the sensor locations given just the matrix coordinates (row, column) of each module 78 that has a sensor unit 76 attached. A user could enter these coordinates manually as part of the installation process. Similarly, the corner modules could be replaced with modules 70 having built-in sensors 31 as shown in FIG. 7A.

Figure 9A:
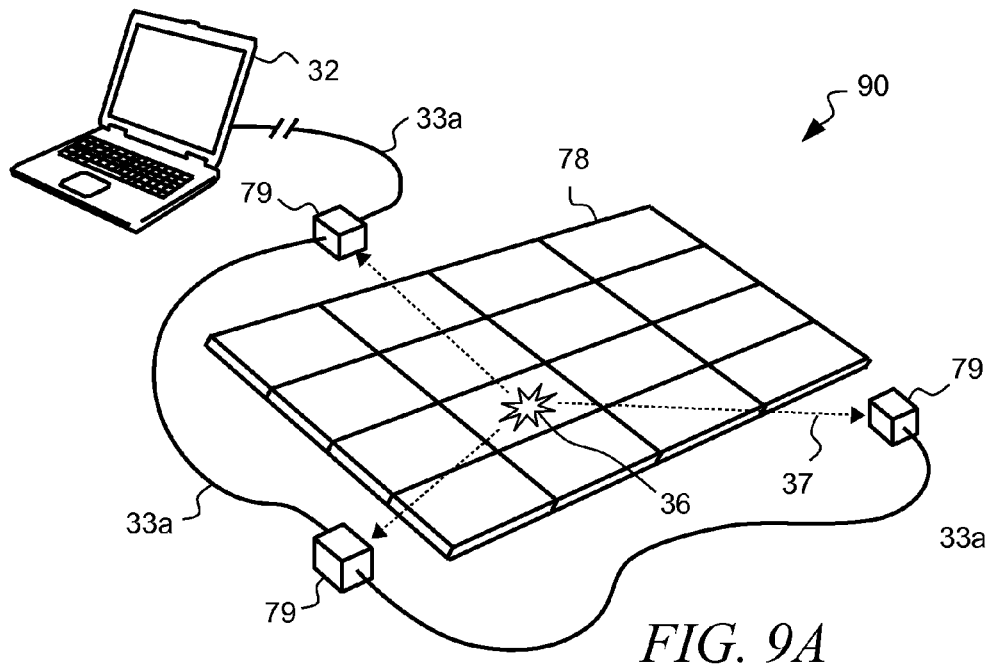
FIG. 9A is an environmental view illustrating the system locating an arc fault.
Figure 9B:
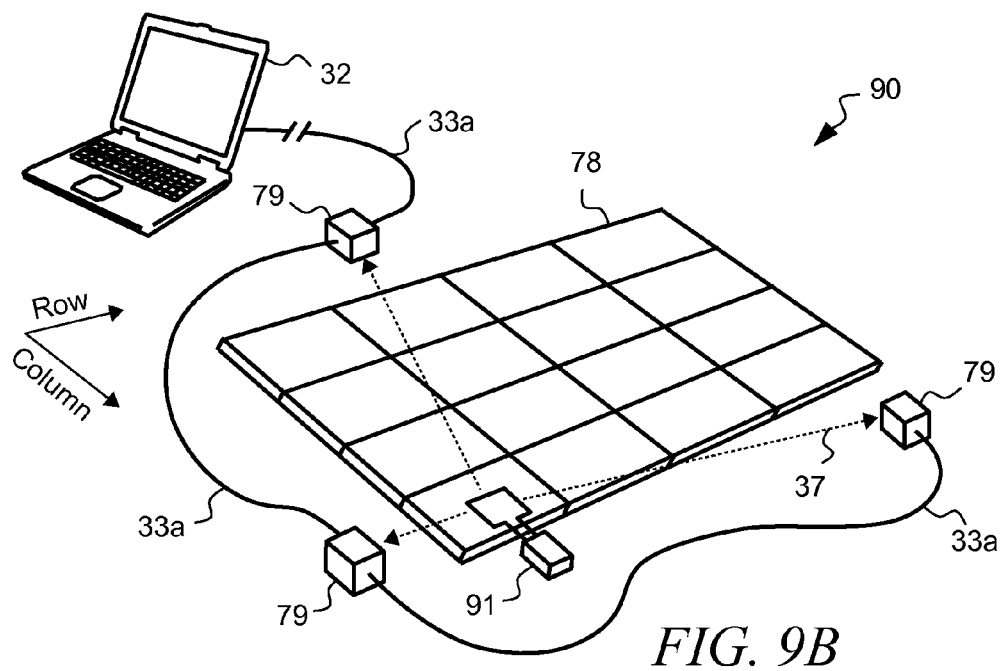
FIG. 9B is an environmental view illustrating the system being calibrated or tested using a hand-held arc simulator.

In some embodiments the sensors are in separate units 79 such as shown in FIG. 7C, and the problem of defining the sensor locations is not as simple. FIG. 9A shows an environmental view of a system 90 constructed with sixteen solar power modules 78 and three separate sensor units 79 arranged at locations around the periphery of the array. One way to define the sensor locations is for someone to simply measure and enter the data manually into the computer 32. FIG. 9B shows another way, where a hand-held arc simulator 91 is used to calibrate the system 90. An operator holds the simulator 91 over a particular solar power module 78 and presses a button to emit a magnetic field that is detected by the sensor assemblies 79. Then the operator enters into the computer which solar power module 78 the simulator 91 was held over, in terms of its row and column number in the array. The procedure is then repeated with at least two more positions. For example, the preferred procedure would be to select at least three modules 78 at the corners of the array, and even more preferably all four corner modules. With these reference points stored, the computer 32 can now determine the location of the arc fault 36 anywhere in the array in terms of the row and column coordinates.

Another use for the simulator 91 is to periodically test the arc fault detection function of the system 90. As with home smoke alarms systems, periodic testing is important to assure the system works when needed. The hand-held arc simulator 91 can be placed near any point in the array, and when the operator presses a button, it emits a magnetic field with a 1/f spectrum similar to an arc fault. The operator can quickly and easily test multiple locations in the array, thus ensuring the whole system works, and there are no blind spots. In contrast, with conventional AFCI an arc simulator must actually be wired into the array, which usually means that testing is confined to a single location.

In summary, the system and apparatus disclosed herein for arc fault detection and location in solar power arrays has many strong advantages over the prior art. First, the general location of the arc can be determined, which is impossible with conventional AFCI systems. Second, false alarms are reduced because the small magnetic loops provide excellent immunity to outside interference. Third, detection of arc faults is more reliable because of the distributed nature of the system: an arc anywhere in the array will be within a short distance of at least one sensor; and the spectral signature of the arc is not distorted by the parasitic filtering effects of the power cables. Fourth, the system is much easier to test.

Although several embodiments have been described in detail for purposes of illustration, various modifications may be made to each without departing from the scope and spirit of the invention. Accordingly, the invention is not to be limited, except as by the appended claims.

What is claimed is:

1. A system for detecting and locating arc faults in a solar power array, comprising:
   a solar power array having at least one string for converting light into electricity, each string comprising one or more segments connected in series, and each segment consisting of a plurality of photovoltaic (PV) cells connected in series;
   a plurality of capacitors, each connected in parallel with a segment of PV cells to form a magnetic loop for producing a time-varying magnetic field in response to an arc fault within the magnetic loop;
   at least three magnetic field sensors for detecting the time-varying magnetic field produced by the magnetic loop;
   a computer having data defining the location of each magnetic field sensor in relation to the solar power array, for determining the location of the arc fault by analyzing data from the magnetic field sensors; and
   a communication network for linking the magnetic field sensors to the computer.

2. The system of claim 1, wherein each magnetic field sensor:
   acquires data representing magnetic field intensity in a plurality of frequencies; and
   analyzes the acquired data to detect relative changes in magnetic field intensity versus frequency approximating the spectral signature typical of an arc fault.

3. The system of claim 1, wherein the communication network comprises a cable carrying information from at least one magnetic field sensor to the computer.

4. The system of claim 1, wherein the communication network comprises a means for communicating information to the computer via radio waves.

5. The system of claim 1, wherein the communication network comprises a means for communicating information to the computer via at least one power line.

6. A solar power module comprising:
   one or more segments comprising a plurality of photovoltaic (PV) cells connected in series for converting light into electricity;
   one or more capacitors, each connected in parallel with a segment of PV cells to form a magnetic loop for producing a time-varying magnetic field in response to an arc fault within the magnetic loop;
   a magnetic field sensor for detecting the time-varying magnetic field produced by at least one magnetic loop;
   a network interface coupled to the magnetic field sensor for communicating with a computer; and
   a power supply for powering the magnetic field sensor and the network interface.

7. The solar power module of claim 6, wherein each magnetic field sensor:
   acquires data representing magnetic field intensity in a plurality of frequencies; and
   analyzes the acquired data to detect relative changes in magnetic field intensity versus frequency approximating the spectral signature typical of an arc fault.

8. The solar power module of claim 6, wherein the network interface comprises a means for communicating information to the computer via radio waves.

9. The solar power module of claim 6, wherein the network interface comprises a means for communicating information to the computer via at least one power line.

10. The solar power module of claim 6, wherein the power supply receives power from at least one of the PV cells.

* * * * *